United States Patent [19]
Yen

[11] Patent Number: 5,812,293
[45] Date of Patent: Sep. 22, 1998

[54] A/V SIGNAL TRANSMISSION REMOTE CONTROL SYSTEM

[76] Inventor: Kerl Yen, No. 3, Tzu Chiang I Rd., Chung Li City, Tao Yuan Hsien, Taiwan

[21] Appl. No.: 775,746

[22] Filed: Dec. 31, 1996

[51] Int. Cl.[6] .................................................. H04B 10/00
[52] U.S. Cl. ......................... 359/145; 341/176; 359/146; 348/734; 455/352
[58] Field of Search ................................ 359/146, 195; 455/352; 398/734

[56] References Cited

U.S. PATENT DOCUMENTS

| 5,142,397 | 8/1992 | Dochery | 359/145 |
| 5,613,191 | 3/1997 | Hylton et al. | 455/3.1 |

*Primary Examiner*—Robert B. Harrell
*Assistant Examiner*—David M. Ovedovitz
*Attorney, Agent, or Firm*—Rosenberg, Klein & Bilker

[57] ABSTRACT

An A/V signal transmission remote control system including an A/V sender having an EEPROM adapted for storing the content and format of an infrared control signal for controlling an A/V output equipment for example a VCR and a CPU controlled by a UHF (418 Mhz) signal from a system remote controller to fetch data from the EEPROM and to convert the fetched data into an infrared signal for controlling the A/V output equipment, permitting the remote control signal and the A/V signal to be transmitted to an A/V receiver so that the user can enjoy the program sent from the A/V output equipment and simultaneously monitor the control of the system remote controller.

7 Claims, 2 Drawing Sheets

A/V SIGNAL TRANSMISSION REMOTE CONTROL SYSTEM

BACKGROUND OF THE INVENTION

The present invention relates to an A/V signal transmission remote control system which uses UHF technology to match with CPU, memory, A/V receiver and OSD processing loop, permitting the output A/V program of an A/V output equipment to be sent to a remote display.

Conventional commercially available A/V senders commonly use 900 Mhz or 2.4 Ghz to modulate the A/V signal of a VCR (videocassette recorder) or satellite receiver, and then to send the modulated signal to an A/V receiver, permitting the modulated signal to be demodulated by the A/V receiver and then sent by it to a monitor, or a TV having A/V terminals. A system of this design permits the user to send a program from for example a VCR in the living room to a monitor in the kitchen or bedroom. However, when to control or regulate the functions of the VCR (for example, when the user wishes to reverse the tape, to change the mode of play to the mode of record, etc.), the user shall have to go to the VCR and then to manually operate the control buttons of the VCR.

SUMMARY OF THE INVENTION

It is the main object of the present invention to provide an A/V signal transmission remote control system which allows the user to remote-control an A/V output equipment when enjoy a program sent from the A/V output equipment through an A/V sender. According to the present invention, the A/V sender of the A/V signal transmission remote control system uses a CPU to match with a peripheral circuit unit (memory, OSD processing loop, etc.) to analyze and decode an A/V output equipment control signal and then to store it in a memory; a UHF (418 Mhz) signal from the system remote controller is sent to the A/V sender and demodulated into a low frequency control signal for controlling the CPU to fetch the data from the memory, permitting the fetched data to be sent through an infrared transmitter to the VCR to control its operation. When the CPU reads the remote control signal, the remote control signal is simultaneously sent to the A/V transmitting loop through an OSD processing loop, so that the user can watch the program of the A/V output equipment through a monitor or TV at a distance far away from the A/V output equipment, and simultaneously monitor the control of the system remote controller.

DETAILED DESCRIPTION OF THE PREFERRED EMBODIMENT

Figure 1:
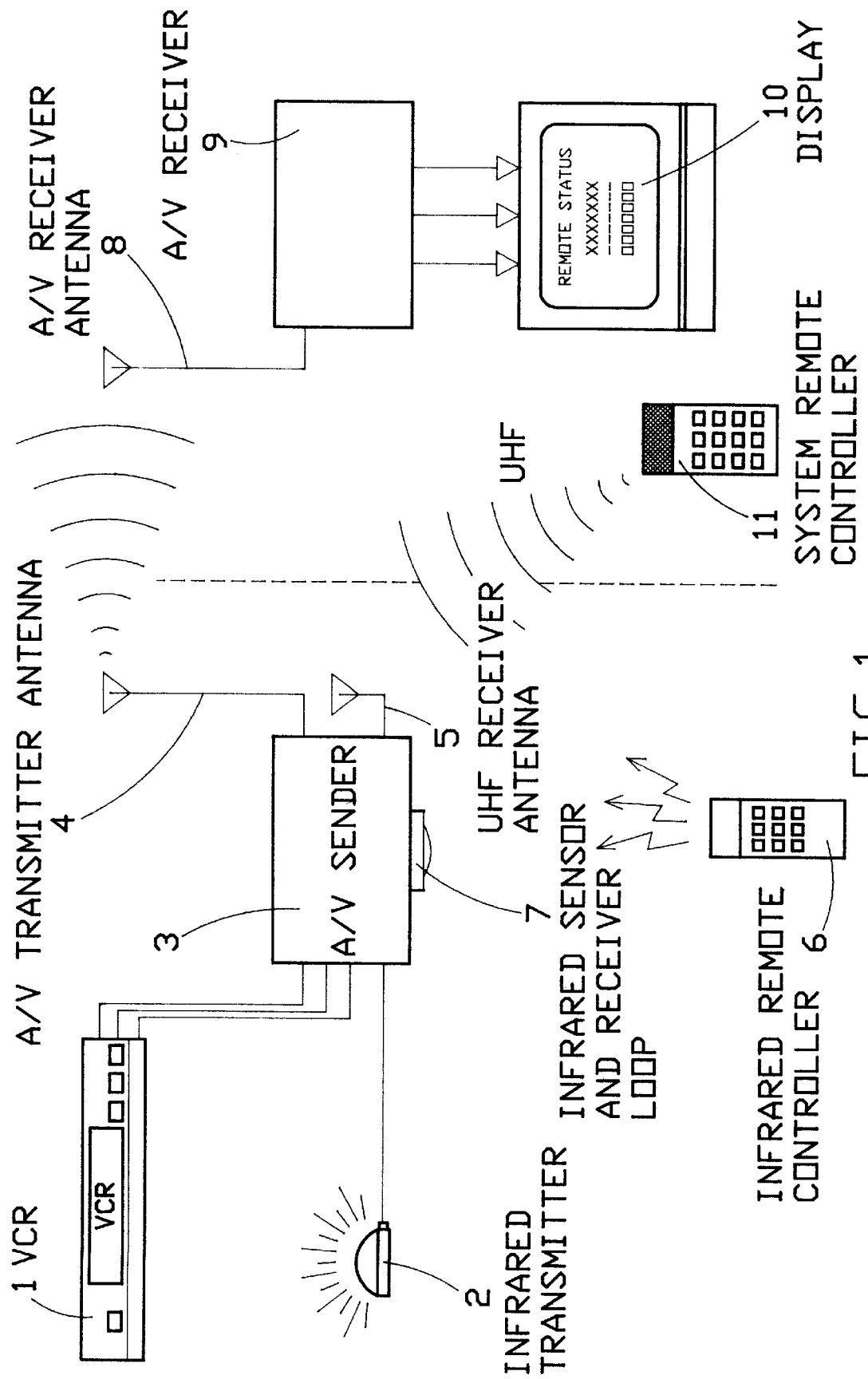
FIG. 1 shows the system arrangement of the present invention.
Figure 2:
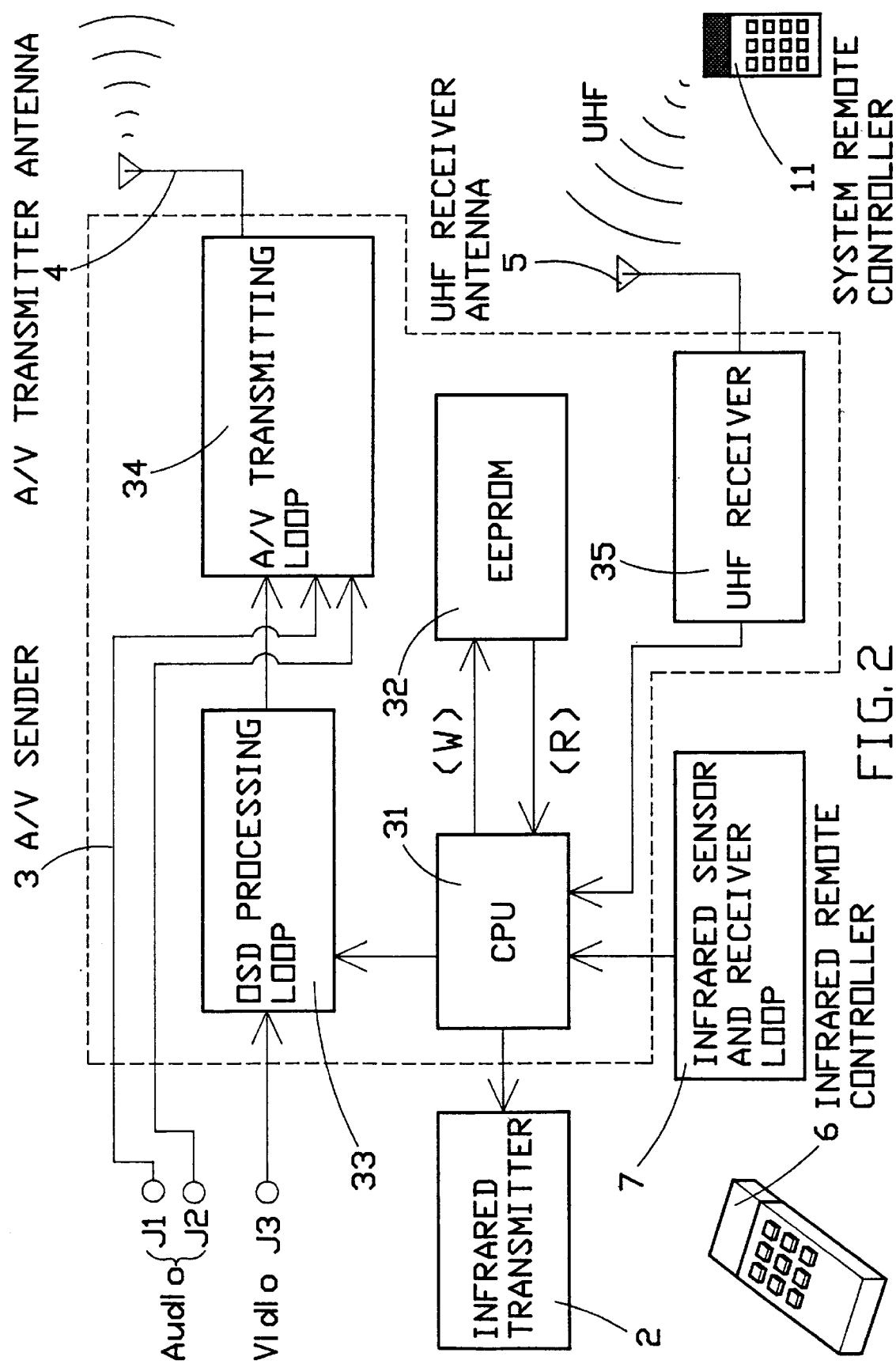
FIG. 2 is a circuit block diagram of an A/V sender according to the present invention.

Referring to FIGS. 1 and 2, an A/V (audio/video) signal transmission remote control system in accordance with the present invention, is generally comprised of an A/V output equipment (for example a videocassette recorder or a satellite receiver) 1, an infrared transmitter 2, an A/V sender 3, an A/V sender antenna 4, a UHF receiver antenna 5, an infrared remote controller 6, an infrared sensor and receiver loop 7, an A/V receiver antenna 8, an A/V receiver 9, a display for example a monitor or TV 10, and a system remote controller 11.

The A/V sender 3 is comprised of a CPU (central processing unit) 31, an EEPROM (electronically erasable programmable read-only memory) 32, an OSD (On-Screen-Display) processing loop 33, an A/V transmitting loop 34, and a UHF receiver 35. The CPU 31 is connected to the OSD processing loop 33. The OSD processing loop 33 has an input end connected to the video port of the A/V output equipment 1 through a J3 terminal, and an output end connected to the A/V transmitting loop 34. The A/V transmitting loop 34 has an input end connected to the audio port of the A/V output equipment 1 by a J1 terminal and a J2 terminal, and an output end connected to the A/V sender antenna 4. The A/V transmitting loop 34 receives audio signal and remote control signal from the ODS processing loop 33, modulates and amplifies received signals, and then sends out the modulated and amplified signals through A/V sender antenna 4. The CPU 3 is connected to the infrared sensor and receiver loop 7 and the EEPROM 32. The infrared sensor and receiver loop 7 receives an infrared signal from the infrared remote controller 6, demodulates the infrared signal into a digital signal, and then sends the digital signal to the CPU 31 for processing, permitting it to be processed by the CPU 31 and then written in the EEPROM 32. The CPU 31 is also connected to the infrared transmitter 2 and the UHF receiver 35. The UHF receiver antenna 5 is connected to the UHF receiver 35. The infrared transmitter 2 is controlled to fetch data from the EEPROM 32, and demodulates the data into an infrared signal for controlling the A/V output equipment 1.

When the user operates the system remote controller 11 (which comprises a UHF modulator of which the frequency is set at 418 MHz) to send a radio or microwave control signal, the control signal is immediately received by the UHF receiver antenna 5 and transmitted by it to the UHF receiver 35 for processing through an amplification and demodulation procedure. The processed signal is then sent by the UHF receiver 35 to the CPU 31. Upon receipt of the signal, the CPU 31 immediately fetches corresponding data from the EEPROM 32, then processes and encodes the data into a signal, and then sends the signal to the infrared transmitter 2, permitting the signal to be modulated into an infrared transmitter signal for controlling the operation of the A/V output equipment 1. At the same time, the CPU 31 sends the data fetched from the EEPROM 32 to the OSD processing loop 33 for processing with the video signal from the A/V output equipment 1. The processed signal is then sent by the OSD processing loop 33 to the A/V transmitting loop 34 for modulation and amplification, and then sent out through the A/V sender antenna 4.

The A/V receiver 9 is connected between the A/V terminals of the display 10 and the A/V receiver antenna 8. When the A/V receiver 9 receives a signal (including audio, video, and control signals) from the A/V receiver antenna 8, the signal is amplified and demodulated, and then the demodulated signal is sent to the display 10. Through the display 10, the user can enjoy the program sent from the A/V output equipment 1, and at the same time monitor the operation of the remote controller.

It is to be understood that the drawings are designed for purposes of illustration only, and are not intended as a definition of the limits and scope of the invention disclosed.

What the invention claimed is:

1. An audio/video signal transmission remote control system comprising:

an audio/video output equipment having an audio terminal and a video terminal;

an audio/video sender, said audio/video sender comprising a OSD (On-Screen-Display) processing loop connected to the video terminal of said audio/video output equipment, an audio/video transmitting loop connected to an output end of said OSD processing loop and having an input end connected to the audio terminal of said audio/video output equipment and an output end connected to an audio/video sender antenna thereof, a CPU (central processing unit) connected to said OSD processing loop, a memory connected to said CPU, and a UHF receiver connected to said CPU;

an infrared sensor and receiver loop connected to said CPU, said infrared sensor and receiver loop receiving an infrared signal from an infrared remote controller, then processing and demodulating the infrared signal, and then storing the demodulated signal in said memory;

an infrared transmitter connected to said CPU to receive data fetched by said CPU from said memory and to modulate the received data into an infrared signal for controlling said A/V output equipment;

a UHF receiver antenna connected to said UHF receiver to receive a UHF signal from a system remote controller and to send the received UHF signal to said UHF receiver for processing into a control signal for controlling said CPU to fetch corresponding data from said memory and to send the fetched data to said OSD processing loop and simultaneously to encode the fetched data, permitting the encoded signal to be sent to said infrared transmitter for modulating into an infrared signal for controlling said audio/video output equipment, the data which is sent to said OSD processing loop being processed by said OSD processing loop and then sent to said audio/video transmitting loop for transmission through said audio/video sender antenna; and an audio/video receiver connected to an audio/video terminals of a display, having an audio/video receiver antenna adapted to receive a signal from said audio/video transmitter and then to amplify and demodulate the received signal, permitting the demodulated signal to be sent to said display, so that the user can enjoy the program sent from said audio/video output equipment and at the same time monitor the control of the remote controller of the system.

2. The audio/video signal transmission remote control system of claim 1 wherein said audio/video output equipment is a videocassette recorder.

3. The audio/video signal transmission remote control system of the claim 1 wherein said audio/video output equipment is a satellite receiver.

4. The audio/video signal transmission remote control system of claim 1 wherein said memory is an EEPROM (electronically erasable programmable read-only memory).

5. The audio/video signal transmission remote control system of claim 1 wherein the transmission frequency of said audio/video sender is set at 900 MHz.

6. The audio/video signal transmission remote control system of claim 1 wherein the transmission frequency of said audio/video sender is set at 2.4 Ghz.

7. The audio/video signal transmission remote control system of claim 1 wherein the transmission frequency of the UHF signal of the system remote controller is set at 418 MHz.

* * * * *